(12) United States Patent
Teng

(10) Patent No.: US 7,104,311 B1
(45) Date of Patent: Sep. 12, 2006

(54) HEAT SINK ASSEMBLY

(75) Inventor: Chia-Ru Teng, Taipei (TW)

(73) Assignee: KWO GER Metal Technology, Inc., Taipei Hsien (TW)

( * ) Notice: Subject to any disclaimer, the term of this patent is extended or adjusted under 35 U.S.C. 154(b) by 0 days.

(21) Appl. No.: 11/163,362

(22) Filed: Oct. 17, 2005

(51) Int. Cl.
*H05K 7/20* (2006.01)
(52) U.S. Cl. .................. 165/80.3; 361/704; 361/697; 165/121
(58) Field of Classification Search .............. None
See application file for complete search history.

(56) References Cited

U.S. PATENT DOCUMENTS

| | | | | |
|---|---|---|---|---|
| 5,558,155 A | * | 9/1996 | Ito ........................ | 165/80.3 |
| 6,336,498 B1 | * | 1/2002 | Wei ....................... | 165/80.3 |
| 6,422,307 B1 | * | 7/2002 | Bhatti et al. ............ | 165/185 |
| 6,449,160 B1 | * | 9/2002 | Tsai ....................... | 361/709 |
| 6,474,407 B1 | * | 11/2002 | Chang et al. ............ | 165/80.3 |
| 6,607,028 B1 | * | 8/2003 | Wang et al. ............. | 165/185 |
| 6,619,381 B1 | * | 9/2003 | Lee ........................ | 165/78 |
| 6,644,386 B1 | * | 11/2003 | Hsu ........................ | 165/80.3 |
| 2004/0150955 A1 | * | 8/2004 | Lin ........................ | 361/709 |
| 2004/0194922 A1 | * | 10/2004 | Lee et al. ................ | 165/78 |
| 2005/0279523 A1 | * | 12/2005 | Chen ...................... | 174/52.2 |
| 2006/0118276 A1 | * | 6/2006 | Lee et al. ................ | 165/80.3 |

* cited by examiner

*Primary Examiner*—Allen J. Flanigan

(57) ABSTRACT

A heat sink assembly formed of a number of radiation fins arranged in a stack, each radiation fin having two mounting flanges arranged in parallel at two opposite sides, each mounting flange having a dovetail mounting hole on the middle and a dovetail bottom mounting lug, the dovetail bottom mounting lugs of one radiation fin being engaged into the mounting holes of another radiation fin.

5 Claims, 10 Drawing Sheets

HEAT SINK ASSEMBLY

BACKGROUND OF THE INVENTION

1. Field of the Invention

The present invention relates to heat sinks for dissipating heat from an electronic device, for example, the CPU of a computer or the like and more particularly, to a heat sink assembly, which is made by fastening a number of radiation fins into a stack.

2. Description of the Related Art

Following fast development of modern information technology, advanced personal computers, PDAs (Personal Digital Assistants), notebook computers of relatively higher operation speed and better computing function have been continuously created. The chips in these advances electronic devices produce much heat during operation. In order to keep normal functioning, heat must Heat sinks and fans are commonly used for this purpose. A heat sink for this purpose generally has a number of radiation fins arranged in parallel on a metal bottom plate. Increasing the installation density of the radiation fins on the metal bottom plate greatly increases the heat dissipation efficiency of the heat sink, however, it will complicate the installation procedure.

FIGS. 8 and 9 show a heat sink assembly according to the prior art. According to this design, the heat sink assembly A is comprised of one front radiation fin A1, one rear radiation fin A2, and a number of intermediate radiation fins A3. The front radiation fin A1 has a bottom mounting flange A11, which defines a coupling groove A111 at the back side. The rear radiation fin A2 has a bottom mounting flange A21, which has a front protruding portion A211 at the front side. Each intermediate radiation fin A3 has a bottom mounting flange A31, which has a rear coupling groove A312 at the back side and a front protruding portion A311 at the front side. By means of engaging the respective front protruding portions A211 and A311 into the respective rear coupling grooves A312 and A111, the radiation fins A1, A2 and A3 are fastened together, forming a heat sink assembly. This design of heat sink assembly still has drawbacks as follows.

1. Because three stamping dies must be prepared for the front, rear and intermediate radiation fins, the manufacturing cost of this heat sink assembly is high.

2. The engagement between the respective front protruding portions and the respective rear coupling grooves cannot prohibit displacement of the radiation fins relative to one another during installation.

3. The design of the front protruding portion and/or rear coupling groove at the bottom mounting flange of each radiation fin consumes much material and requires much labor, thereby increasing the manufacturing cost of the heat sink assembly.

4. The precision of the engagement between each front protruding portion and the respective rear coupling groove is critical, complicating the fabrication of the radiation fins.

FIGS. 10 and 11 show another design of heat sink assembly according to the prior art. According to this design, the heat sink assembly C is comprised of a plurality of radiation fins B arranged in parallel. The radiation fins B each have a flat base B1 and a plurality of mounting flanges B2 respectively perpendicularly extending from the flat base B1. Each mounting flange B2 has a hook B21 at one side and a lug B3 at an opposite side. The lug B3 defines therein a hook hole B31. By means for forcing the hooks B21 of one radiation fin B into hook holes B31 of the lugs B3 of another radiation fin B, the radiation fins B are fastened together, thereby forming the desired heat sink assembly C. This design of heat sink assembly still has drawbacks as follows.

1. The mounting flanges B2 must be bent from the flat base B1 precisely. A small precision error may result in a connection failure between two radiation fins B.

2. The hooks B21 and hook holes B31 of the lugs B3 of one radiation fin B must correspond to the hook holes B31 and hooks B21 of another radiation fin B precisely. A small precision error may result in instability of the connection between two radiation fins B.

3. Every radiation fin B has three mounting flanges B2 with three hooks B21 and three lugs B3. A position error of one hook B21 or lug B3 will result in instability of the heat sink assembly C.

Therefore, it is desirable to provide a heat sink assembly that eliminates the aforesaid drawbacks.

SUMMARY OF THE INVENTION

The present invention has been accomplished under the circumstances in view. It is one object of the present invention to provide a heat sink assembly, which is easy to assemble and inexpensive to manufacture. It is another object of the present invention to provide a heat sink assembly, which keeps the radiation fins thereof firmly secured to one another against falling or tilting during installation. To achieve these and other objects of the present invention, the heat sink assembly comprises a plurality of radiation fins arranged in a stack. The radiation fins each have a top surface, and two mounting flanges arranged in parallel at two opposite sides. The mounting flange of one radiation fin is stopped against the top surface of another radiation fin. The mounting flanges of the radiation fins have at least one mounting hole and at least one mounting lugs respectively downwardly extending from the bottom edge thereof corresponding to the at least one mounting hole. The at least one mounting hole and the at least one mounting lug each have a width gradually increasing in direction from the top toward the bottom. The mounting lugs of one radiation fin are respectively engaged into the mounting holes of another radiation fins. Further, the mounting holes of the radiation fins are dovetail holes, and the mounting lugs of the radiation fins are dovetail lugs.

DETAILED DESCRIPTION OF THE PREFERRED EMBODIMENT

Figure 1:
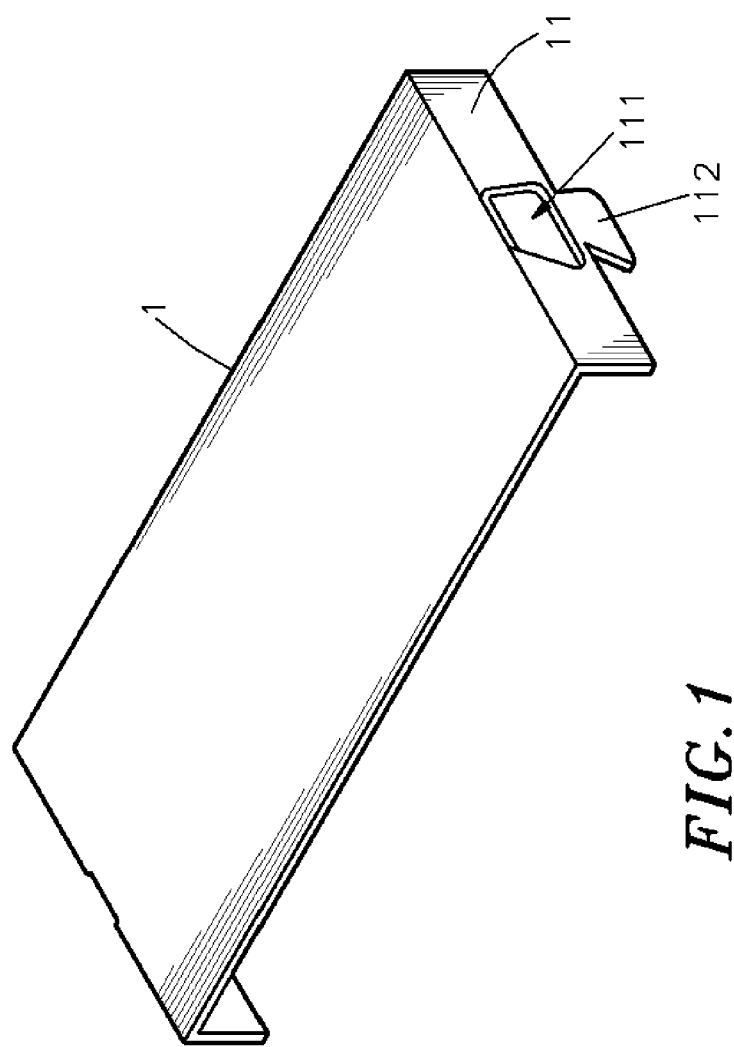
FIG. 1 is an elevational view of a radiation fin for a heat sink assembly according to the present invention.
Figure 2:
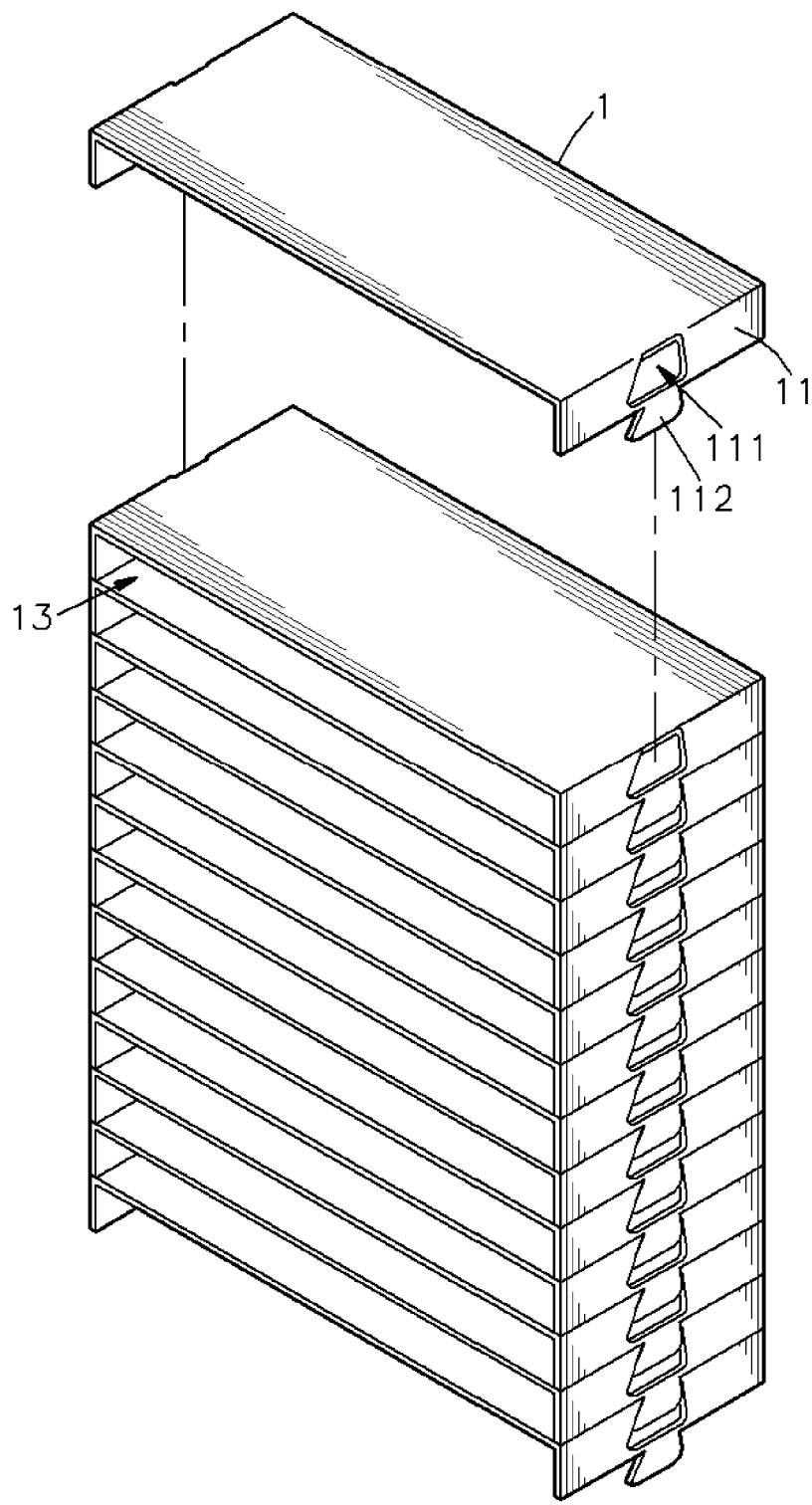
FIG. 2 is an exploded view of a heat sink assembly according to the present invention.
Figure 3:
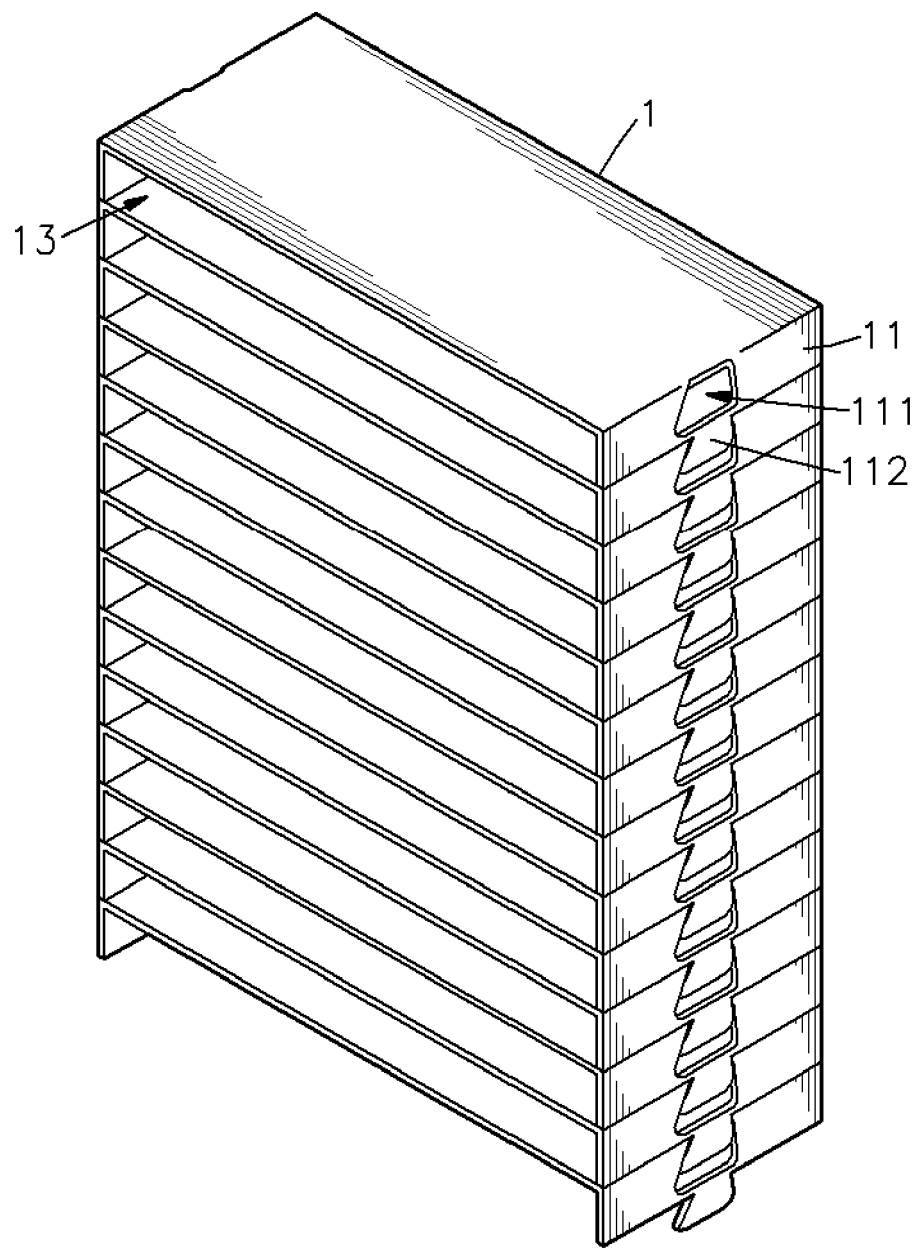
FIG. 3 is an elevational view of a heat sink assembly according to the present invention.

Referring to FIGS. 1~3, a heat sink assembly is shown comprised of a plurality of radiation fins 1 arranged in a stack. The radiation fins 1 are flat rectangular metal plate members each having two mounting flanges 11 respectively downwardly extending from the respective two distal ends at right angles. The mounting flanges 11 each have a mounting hole 111 on the middle and a bottom mounting lug 112 downwardly extending from the bottom edge thereof on the middle. The mounting hole 111 has a width gradually increasing from the top toward the bottom. The shape of the mounting lug 112 fits the mounting hole 111, i.e., the mounting lug 112 has a width gradually increasing from the top toward the bottom. According to this embodiment, the mounting hole 111 of each mounting flange 11 is a dovetail hole. The mounting lug 112 of each mounting flange 11 is a dovetail lug. By forcing the mounting lugs 112 of one radiation fin 1 into the mounting holes 111 of another radiation fin 1, the radiation fins 1 are fastened together in a stack with the bottom edges of the mounting flanges 11 of one radiation fin 1 stopped against the top surface of another radiation fin 1 and a gap 13 left between each two adjacent radiation fins 1, thereby forming a heat sink assembly. Because the mounting holes 111 are dovetail holes and the mounting lugs 112 are dovetail lugs, the radiation fins 1 are firmly secured together when they are arranged in a stack with the respective mounting lugs 112 forced into the respective mounting holes 111.

Figure 4:
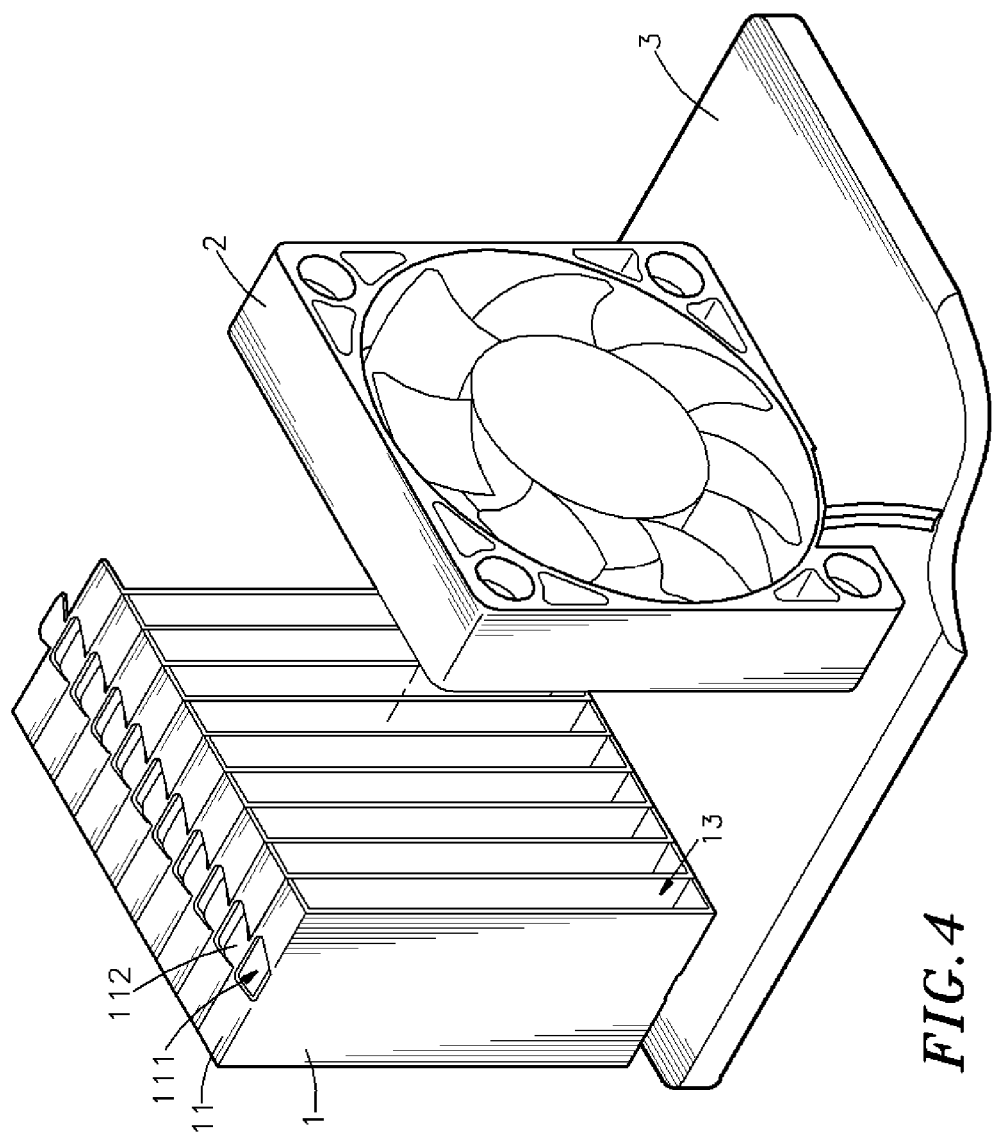
FIG. 4 is a schematic drawing showing the use of one heat sink assembly with a fan on a metal plate member according to the present invention.
Figure 5:
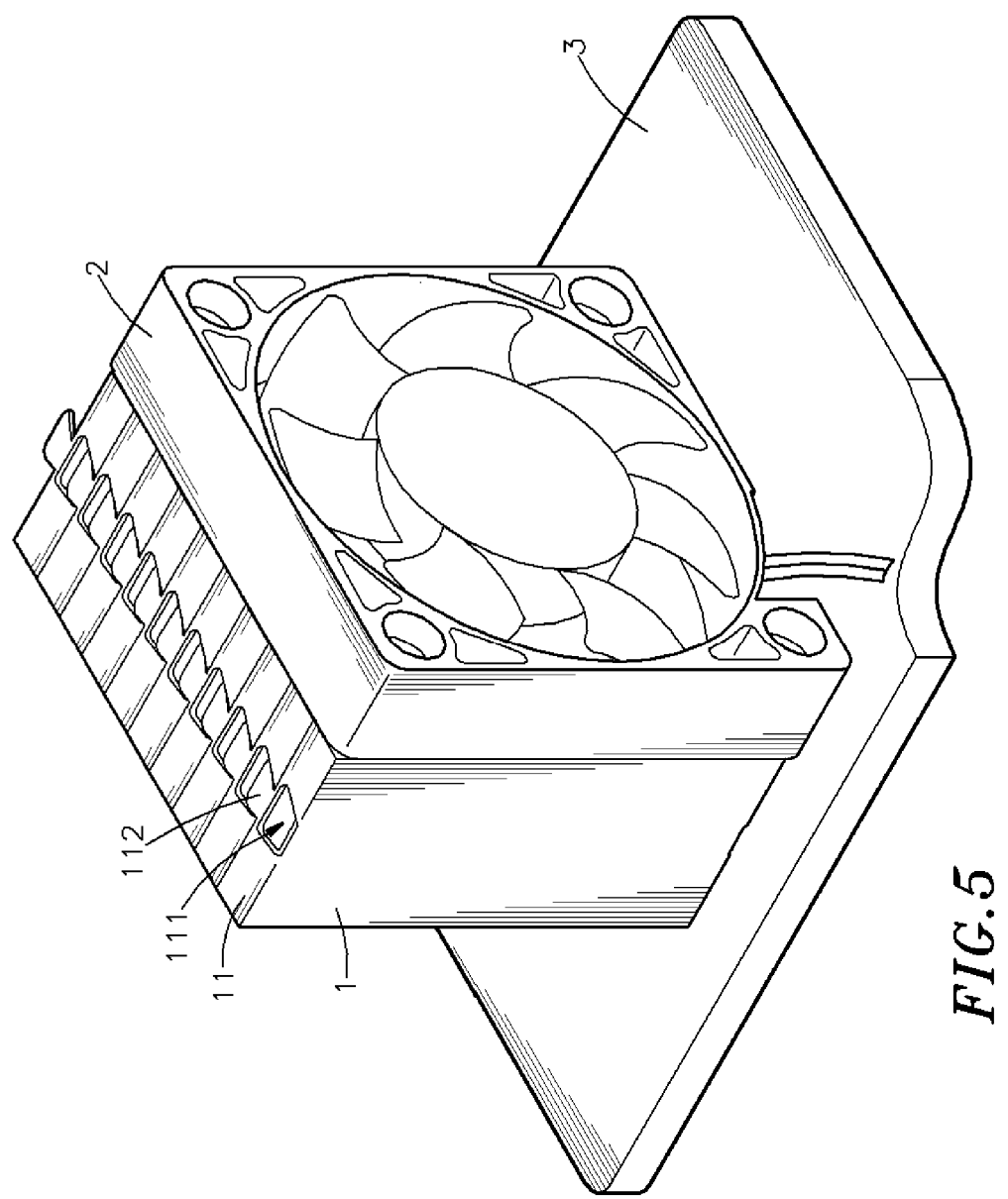
FIG. 5 is an assembly view of FIG. 4.

Referring to FIGS. 4 and 5, a number of radiation fins 1 are fastened together to form a heat sink assembly, which is fastened to one side of a fan 2 and then mounted with the fan 2 on a metal plate member 3 for fastening to a heat source on a circuit board, for example, a CPU on a motherboard (not shown) for dissipating heat from the CPU during the operation of the CPU. Alternatively, the heat sink assembly that is formed of a number of radiation fins 1 can be directly fastened to the metal plate member 3 at first, and then the fan 2 is fixedly fastened to the heat sink assembly at one side. By means of the metal plate member 3, the heat sink assembly is fixedly fastened to the heat source at the circuit board (not shown), for enabling heat energy to be transferred from the heat source to the radiation fins 1, and at the same time the fan 2 blows cool air toward the gap 13 between each two adjacent radiation fins 1 to dissipate heat from the radiation fins 1 into the outside open air. Therefore, the invention achieves a satisfactory heat dissipation effect. Further, the radiation fins 1 may be fastened to the metal plate member 3 by bonding or welding, or any of a variety of fastening devices. The engagement between the respective mounting holes 111 and the respective mounting lugs 112 secures the radiation fins 1 firmly together, preventing falling of the radiation fins 1 from one another or tilting of the radiation fins 1 relative to one another during installation.

Figure 6:
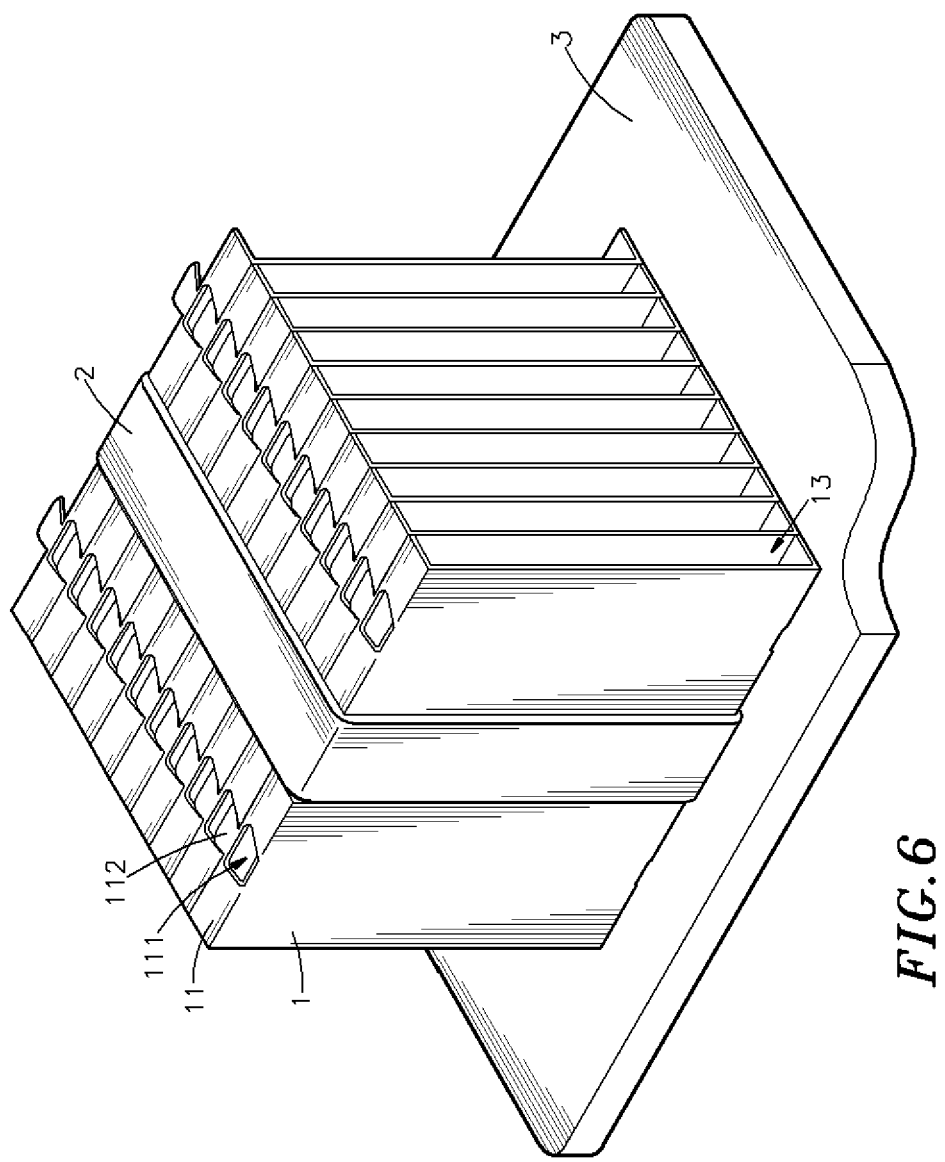
FIG. 6 is a schematic drawing showing another application example of the present invention.

FIG. 6 shows another application example of the present invention. According to this embodiment, two heat sink assemblies are provided at two sides of a fan 2 and mounted with the fan 2 on a metal plate member 3.

Further, the number of the mounting holes 111 and mounting lugs 112 of each radiation fin 1 and the locations of the mounting flanges 11 at each radiation fin 1 may be changed without departing from the spirit and scope of the invention.

Figure 7:
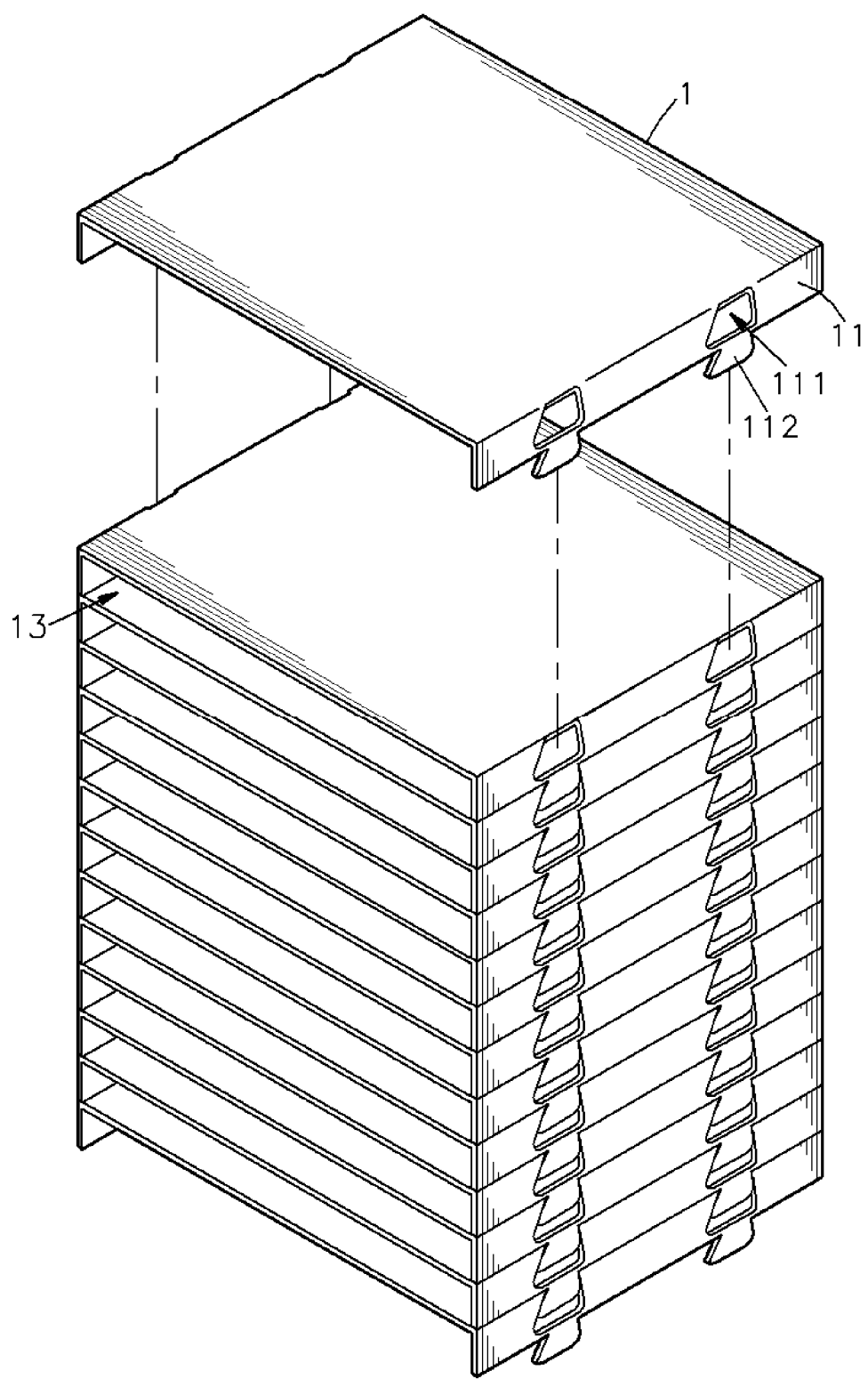
FIG. 7 is an exploded view of an alternate form of the heat sink assembly according to the present invention.
Figure 8:
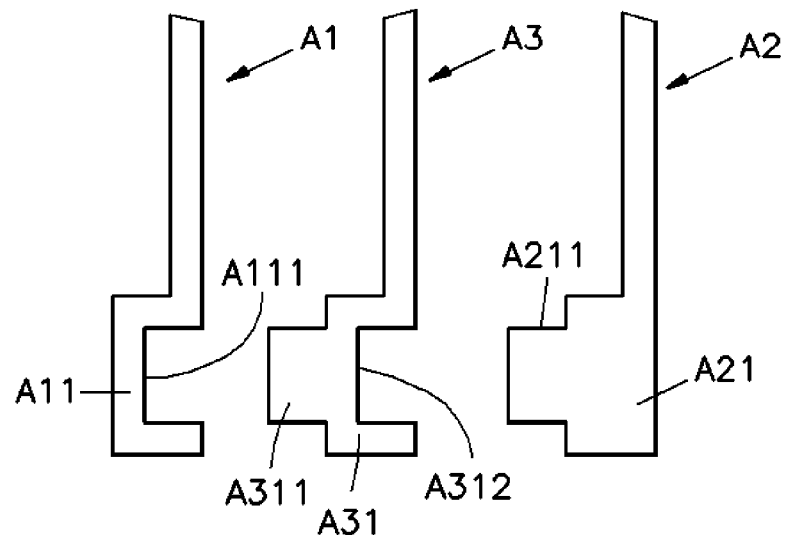
FIG. 8 is a side plain view of three different radiation fins for a heat sink assembly according to the prior art.
Figure 9:
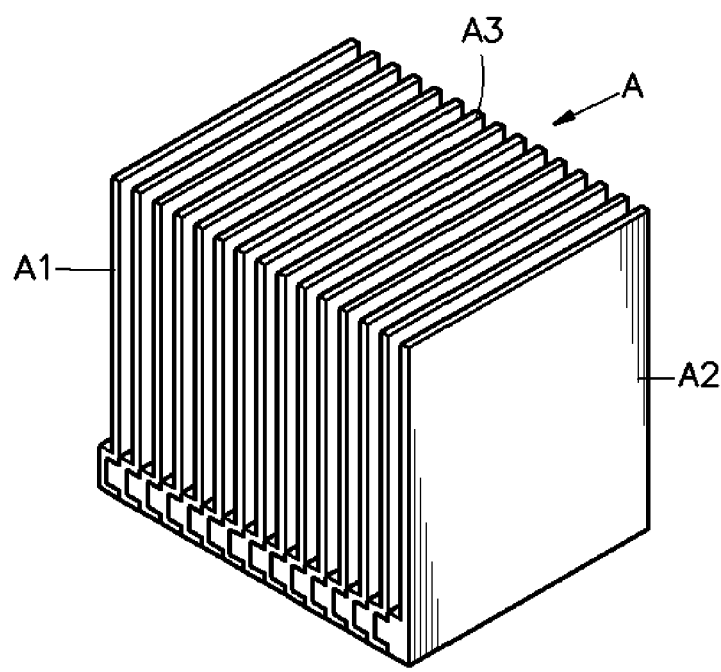
FIG. 9 is an elevational assembly view of a heat sink assembly according to the prior art.
Figure 10:
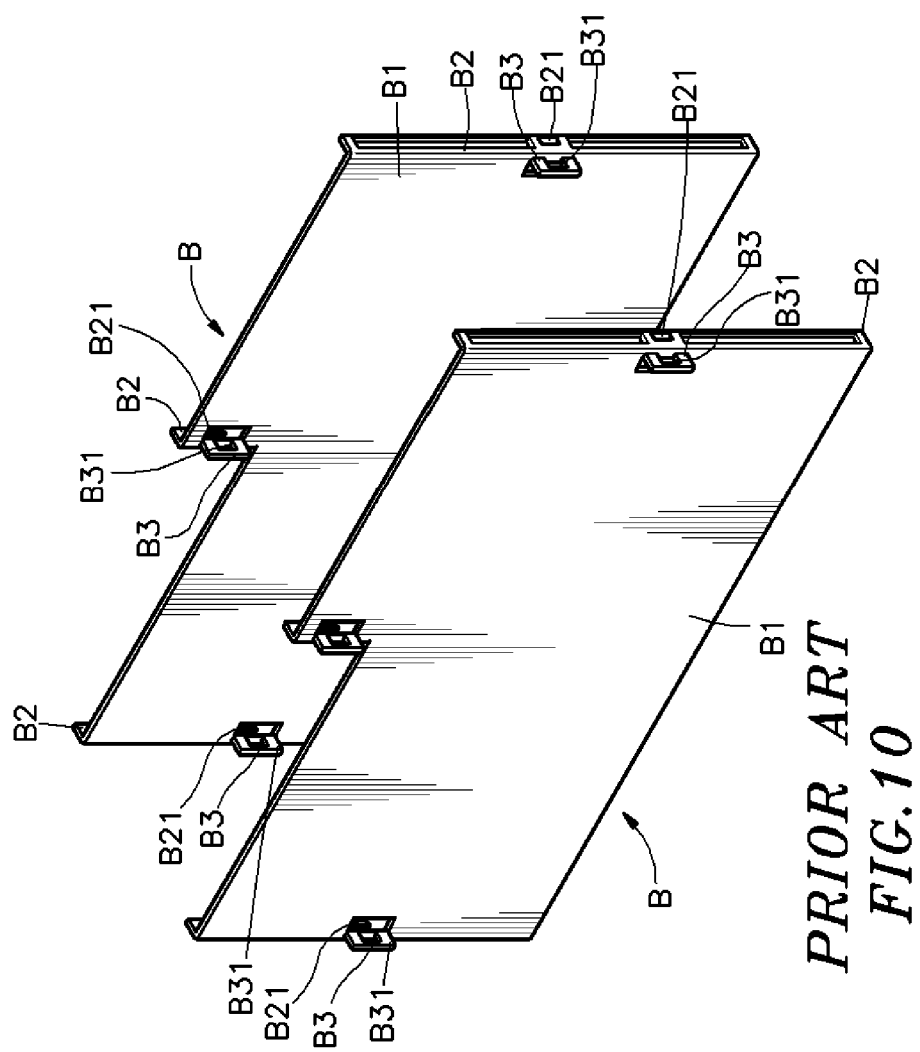
FIG. 10 shows the structure of another design of radiation fins for heat sink assembly according to the prior art.
Figure 11:
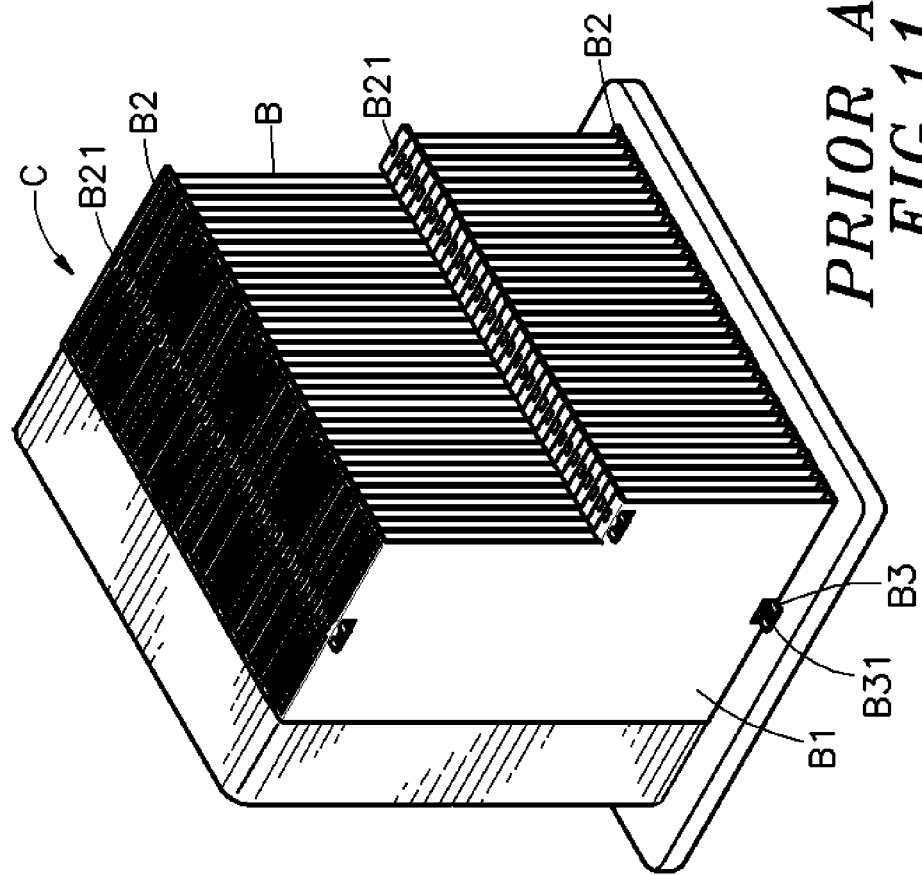
FIG. 11 is an elevational assembly view of a prior art heat sink assembly formed of the radiation fins shown in FIG. 10.

FIG. 7 shows an alternate form of the present invention. According to this embodiment, each radiation fin 1 has two mounting flanges 11 arranged in parallel at two opposite sides. Each mounting flange 11 has two dovetail mounting holes 111 and two dovetail mounting lugs 112 downwardly extending from the bottom edge corresponding to the dovetail mounting holes 111. By means of forcing the respective dovetail mounting lugs 112 of one radiation fin 1 into the respective dovetail mounting holes 111 of another radiation fin 1, the radiation fins 1 are fastened together in a stack, forming a heat sink assembly. This embodiment achieves the same effect as the aforesaid first embodiment of the present invention.

As indicated above, the invention provides a heat sink assembly, which has the following features.

1. By means of forcing the respective mounting lugs of one radiation fin into the respective mounting holes of another radiation fin, a number of radiation fins are easily and quickly fastened together in a stack, forming a heat sink assembly. When assembled, the radiation fins do not fall from one another or tilt relative to one another during installation.

2. The mounting lugs and mounting flanges are formed in integrity with the respective radiation fin, i.e., each radiation fin can be directly formed of a metal sheet member by stamping, saving the manufacturing cost.

3. Only one single stamping die is needed for use in a press for stamping a metal sheet member into the desired radiation fin to save the manufacturing cost.

4. The mounting holes and the mounting lugs are made having a dovetail profile for quick installation. This design simplifies the assembly process of the heat sink assembly, and the precision requirement is less critical.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. A heat sink assembly comprising a plurality of radiation fins arranged in a stack, said radiation fins each having a top surface and two mounting flanges arranged in parallel at two opposite sides, the mounting flange of one of said radiation fins being stopped against the top surface of another of said radiation fins, wherein the mounting flanges of said radiation fins have at least one mounting hole and at least one mounting lugs respectively downwardly extending from a bottom edge thereof corresponding to said at least one mounting hole, said at least one mounting hole and said at least one mounting lug each having a width gradually increasing in direction from the top surface of the respective radiation fin toward the bottom edge of the respective mounting flange, the mounting lugs of one of said radiation fin being respectively engaged into the mounting holes of another of said radiation fins.

2. The heat sink assembly as claimed in claim 1, wherein the at least one mounting lug of each mounting flange of each said radiation fin is respectively formed integral with the respective mounting flange.

3. The heat sink assembly as claimed in claim 1, wherein the mounting holes of said radiation fins are dovetail holes.

4. The heat sink assembly as claimed in claim 3, wherein the mounting lugs of said radiation fins are dovetail lugs.

5. The heat sink assembly as claimed in claim 1, wherein the mounting flanges of said radiation fins each have a plurality of mounting holes and a plurality of mounting lugs corresponding to the mounting holes.

* * * * *